United States Patent
Chang et al.

(10) Patent No.: US 10,677,841 B2
(45) Date of Patent: Jun. 9, 2020

(54) COMPOSITE PRODUCT TESTING SYSTEM AND TESTING METHOD

(71) Applicant: Delta Electronics, Inc., Taoyuan (TW)

(72) Inventors: Chien-Chung Chang, Taoyuan (TW); Hung-Pin Yu, Taoyuan (TW); Yu-Jen Chen, Taoyuan (TW); Wen-Jen Lo, Taoyuan (TW); Chih-Yen Liu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 71 days.

(21) Appl. No.: 15/861,441

(22) Filed: Jan. 3, 2018

(65) Prior Publication Data
US 2018/0252764 A1 Sep. 6, 2018

(30) Foreign Application Priority Data
Mar. 2, 2017 (CN) .......................... 2017 1 0120695

(51) Int. Cl.
*G01R 31/28* (2006.01)
*H01L 21/00* (2006.01)
*G01R 1/00* (2006.01)

(52) U.S. Cl.
CPC ....... *G01R 31/2863* (2013.01); *G01R 31/287* (2013.01); *G01R 31/2862* (2013.01); *G01R 31/2879* (2013.01)

(58) Field of Classification Search
CPC ....... H01L 21/00; H01L 2221/00; G01R 1/00; H05K 1/00
See application file for complete search history.

(56) References Cited

U.S. PATENT DOCUMENTS

| 2005/0153465 A1* | 7/2005 | Wada .................. G01R 31/286 438/14 |
| 2007/0233629 A1* | 10/2007 | Balog ............. G01R 31/318314 706/47 |

(Continued)

FOREIGN PATENT DOCUMENTS

| TW | 201022692 A | 6/2010 |
| TW | 201135259 A | 10/2011 |

(Continued)

*Primary Examiner* — Jermele M Hollington
*Assistant Examiner* — Temilade S Rhodes-Vivour
(74) *Attorney, Agent, or Firm* — Muncy, Geissler, Olds & Lowe, P.C.

(57) ABSTRACT

A composite product testing system including a main management system, a test equipment and a burn-in apparatus is disclosed. The test equipment and the burn-in apparatus are both arranged in a burn-in chamber of the testing system. First, multiple tested products are respectively inserted in multiple gauges of the burn-in chamber, and a burn-in procedure is activated for providing an aging environment. The main management system controls one of the gauges to connect with the test equipment for the test equipment to perform testing on the tested product upon the connected gauge. After the testing is completed, the main management system then controls the gauge to disconnect from the test equipment and re-connect with the burn-in apparatus, so as to monitor the tested product upon the gauge during the burn-in procedure.

19 Claims, 7 Drawing Sheets

(56) References Cited

U.S. PATENT DOCUMENTS

| | | | | |
|---|---|---|---|---|
| 2008/0065934 A1* | 3/2008 | Whetsel | ........... | G01R 31/31919 |
| | | | | 714/701 |
| 2011/0000829 A1* | 1/2011 | Linde | ............ | B07C 5/344 |
| | | | | 209/571 |
| 2012/0146673 A1* | 6/2012 | Kim | ............ | G01R 31/3187 |
| | | | | 324/750.3 |
| 2013/0088253 A1* | 4/2013 | Nahar | ............ | G01R 31/2834 |
| | | | | 324/762.01 |
| 2016/0334462 A1* | 11/2016 | Jung | ............ | G01R 31/2862 |
| 2016/0349118 A1* | 12/2016 | Olson | ............ | G01K 7/015 |

FOREIGN PATENT DOCUMENTS

| | | |
|---|---|---|
| TW | 201344211 A | 11/2013 |
| TW | 201407172 A | 2/2014 |

\* cited by examiner

COMPOSITE PRODUCT TESTING SYSTEM AND TESTING METHOD

BACKGROUND

Technical Field

The present invention relates to product testing system, especially to a composite product testing system, and a testing method.

Description of Related Art

During the manufacturing of product, it is important to confirm normal working of the manufactured product. Thus, after each type of product is manufactured, various capabilities of the product are usually tested by one or more test equipment (for example of electric product, there can be noise testing, protection testing, pressure testing etc.). Besides, for some products, burn-in time of the product also can be decreased by burn-in apparatus, thus obtaining change of the product after being used for a long time.

Please refer to FIG. 1, FIG. 1 illustrates a diagram of test environment of related art. Generally, after the product is manufactured, manufacturer puts the product into a first test equipment (automotive test system, ATS) 11 for testing. Specifically, the first test equipment 11 performs testing such as noise testing, protection testing, pressure testing etc., to the product, for determining if the manufactured product has fault.

After the first test equipment 11 is tested, the manufacture puts the product into a product burn-in apparatus 12, to execute burn-in procedure to the product. Specifically, the product burn-in apparatus 12 can be a burn-in chamber, temperature, humidity in the burn-in chamber can be adjusted to provide a burn-in environment. The burn-in environment can decrease burn-in time of the product, and thus to quickly obtain state of the product after being used for a long time.

After the burn-in procedure is finished, the manufacture then puts the product into second test equipment 13 to perform testing again. In this way, it can be tested that if the product after being used for a long time (that is, after the burn-in procedure) can still work normally.

As mentioned above, in the testing method of related art, the product has to pass the first testing, burn-in procedure, and second testing after the burn-in procedure sequentially after manufacturing, thus, the entire testing takes lots of time.

For example, two products can be inserted into gauges of the first test equipment 11 and the second test equipment 13 for testing at the same time, and a testing takes 3 minutes, while a hundred of the products can be inserted into gauges of the product burn-in apparatus 12 (that is, burn-in chamber) for the burn-in procedure at the same time, and a burn-in procedure takes two hours.

In aforementioned embodiment, a testing time spent by testing a hundred of the products will be: (100/2)*3+60*2+(100/2)*3=420 minutes. Because only two products can be tested by the first test equipment 11 at the same time, the burn-in procedure cannot be performed till the first testing of all products has been finished. In this way, it was a waste of time waiting for the first testing.

Moreover, during actual testing, each product needs the following actions to be performed sequentially: (1) inserting the product into the gauge of the first test equipment 11; (2) unloading the product from the gauge of the first test equipment 11 after the first testing is finished; (3) inserting the product into the gauge of the product burn-in apparatus 12; (4) unloading the product from the gauge of the burn-in apparatus 12 after the burn-in procedure is finished; (5) inserting the product into the gauge of the second test equipment 13; and (6) unloading the product from the gauge of the second test equipment 13 after the second testing is finished.

It can be seen from the aforementioned description, for testing, each product needs to be inserted to/unloaded from the gauge three times, this not only takes additional time inserting the product to/unloading the product from the gauge, but also increases risk of damaging the product or gauge with too many times of inserting/unloading, and increases the cost, resulting in inaccurate testing.

SUMMARY

The present invention is mainly directed to provide a composite product testing system and testing method, which can perform burn-in procedure and finish testing procedure for testing product at the same time.

Accordingly, the composite product testing system of the present invention mainly includes a main management system, a test equipment and a burn-in apparatus. The test equipment and the burn-in apparatus are both arranged in a burn-in chamber of the composite product testing system.

First, the plurality of tested products are respectively inserted in multiple gauges of the burn-in chamber, and activates a burn-in procedure to provide burn-in environment in the burn-in chamber, change of temperature, humidity of the burn-in environment makes burn-in time of the product shorter, and thus quickly obtain state of the product after being used for a long time. The main management system then controls one of the gauges connect to the test equipment, for performing testing to the plurality of tested products in the gauges by the test equipment. After the testing is finished, the main management system controls the gauge to disconnect from the test equipment and re-connect to the burn-in apparatus. Then, the main management system sequentially controls the rest set of the gauges connect to and disconnect from the burn-in apparatus and the test equipment before the testing of all tested products is finished, to complete the necessary testing procedure of the plurality of tested products during the burn-in procedure.

The present invention can execute necessary testing procedure meanwhile during the burn-in procedure of the product. Different from the related art, it is necessary to perform testing to each product sequentially first, after a particular amount of products have been tested, multiple tested products are put into the burn-in chamber together to perform testing of the burn-in procedure. Thus, the present invention actually can avoid a waste of testing time effectively, to improve the testing efficiency.

BRIEF DESCRIPTION OF DRAWING

One or more embodiments of the present invention are illustrated by way of example and not limitation in the figures of the accompanying drawings, in which like references indicate similar elements. These drawings are not necessarily drawn to scale.

DETAILED DESCRIPTION

Figure 1:
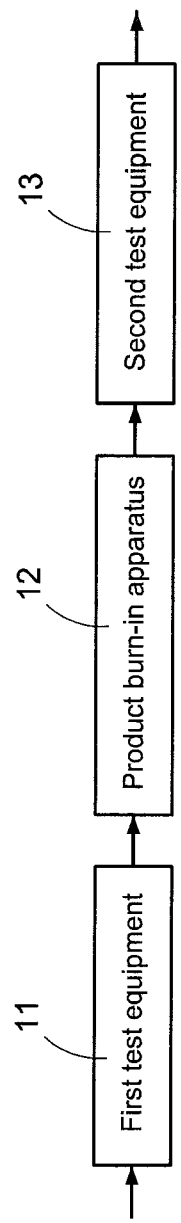
FIG. 1 shows a diagram of test environment of related art.
Figure 2:
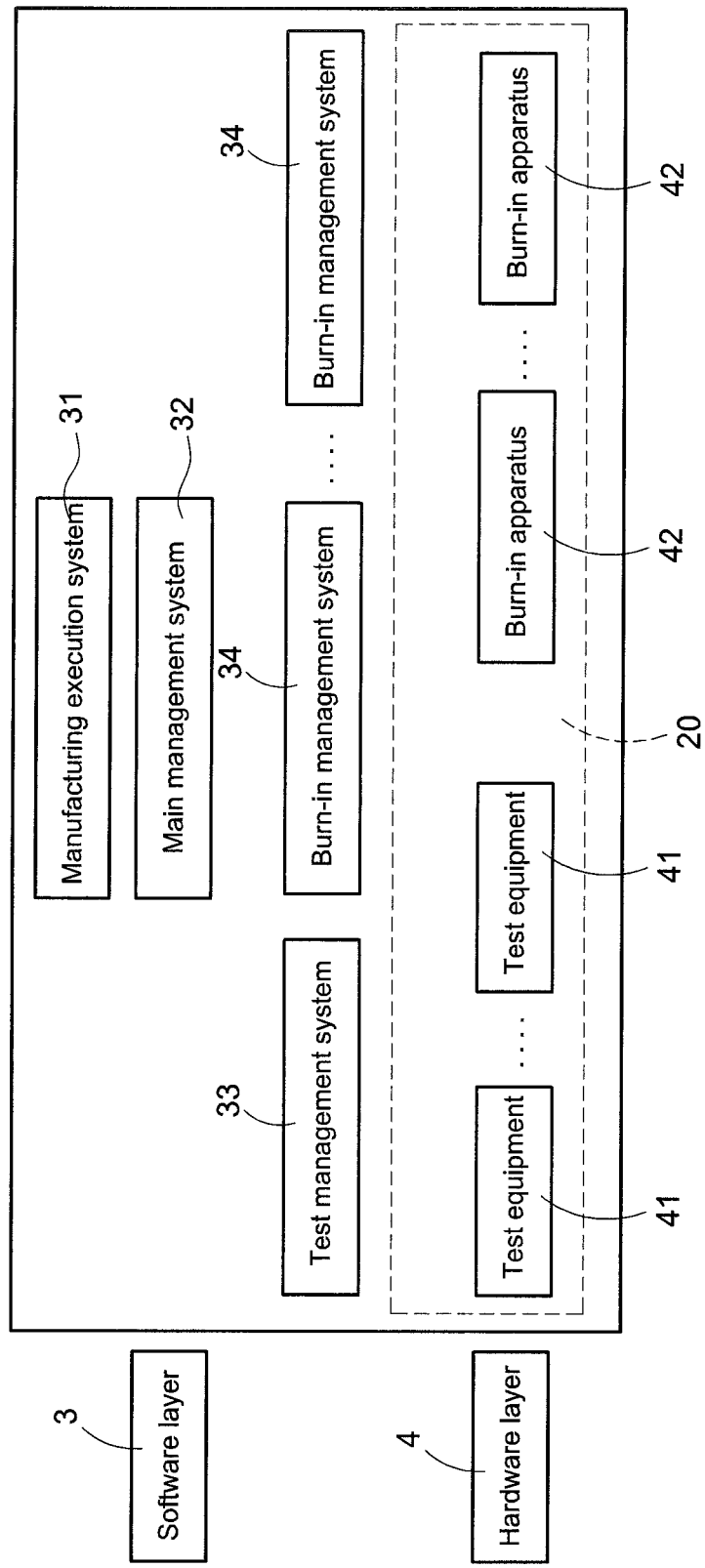
FIG. 2 shows a block diagram of testing system according to a first specific embodiment of the present invention.

Please refer to FIG. 2 first, FIG. 2 shows a block diagram of testing system according to a first specific embodiment of the present invention. The present invention discloses a composite product testing system (hereafter the testing system 2), the testing system 2 performs a testing procedure and a burn-in procedure to the plurality of tested products (hereafter can be product) at the same time, for determining if the manufactured product is good for sale.

As shown in FIG. 2, the testing system 2 mainly includes a software layer 3 and a hardware layer 4. Specifically, the software layer 3 includes the plurality of application programs, the hardware layer 4 includes the plurality of hardware equipment; the plurality of programs in the software layer 3 respectively control the plurality of hardware equipment in the hardware layer 4.

The hardware layer 4 mainly includes a burn-in chamber 20, a test equipment 41 and a burn-in apparatus 42. The test equipment 41 and the burn-in apparatus 42 are both arranged in the burn-in chamber 20. During testing, the testing system 2 activates a burn-in procedure to the burn-in chamber 20, to provide a burn-in environment in the burn-in chamber 20, make the product burn-in time shorter, and thus obtains state of product after being used for a long time quickly.

The test equipment 41 performs testing of each performance to one or more tested products (as the tested product 5 in FIG. 3) connected. In an embodiment, the tested products 5 are electronic products, and the testing includes, but not limited to, noise testing, protection testing, hi-pot testing, efficiency testing, power characteristics testing, communication testing etc.

The burn-in apparatus 42 monitors and collects data of connected one or more tested products 5. In an embodiment, the tested products 5 are electronic products, the burn-in apparatus 42 monitors and collects voltage and/or current data of the tested product 5, to determine if the performance of the tested product 5 changes during the burn-in procedure.

It should be noted that, the testing system 2 can only have, but not limited to, one set of the test equipment 41 and one set of the burn-in apparatus 42 arranged in the burn-in chamber 20, or multiple sets of the test equipment 41 and/or multiple sets of the burn-in apparatus 42.

Specifically, the test equipment 41 only tests a specific capability, thus if multiple capabilities of the tested products 5 are to be tested, multiple sets of the test equipment 41 of various types can be arranged in the burn-in chamber 20 at the same time. Moreover, the burn-in apparatus 42 monitors and collects the data of the tested products 5 during the burn-in procedure, thus multiple sets of the burn-in apparatus 42 can be arranged in the burn-in chamber 20 at the same time for given volume and amount of the tested products 5. For the sake of description, a single set of the test equipment 41 and a single set of the burn-in apparatus 42 are used for example but not limitation in the following.

The software layer 3 includes a manufacturing execution system (MES) 31, the manufacturing execution system 31 monitors, obtains and stores all tests data of the testing system 2, accordingly manages entire manufacturing procedure of all tested products 5.

The software layer 3 also includes a main management system 32, a test management system 33 and a burn-in management system (BIMS) 34. Specifically, the test management system 33 controls the test equipment 41, accordingly the test equipment 41 performs the testing procedure to one or more connected tested products 5. The burn-in management system 34 controls the burn-in apparatus 42, accordingly the burn-in apparatus 42 monitors and collects the data of one or more connected tested products 5 during the burn-in procedure, to determine if the tested products 5 after being used for a long time still can work normally.

The main management system 32 connects to the test management system 33 and the burn-in management system 34, controls the test management system 33 and the burn-in management system 34 according to a specific schedule. Accordingly, the main management system 32 controls the test equipment 41 and the burn-in apparatus 42 respectively by the test management system 33 and the burn-in management system 34, and makes the test equipment 41 and the burn-in apparatus 42 operate and match the specific schedule.

Figure 3:
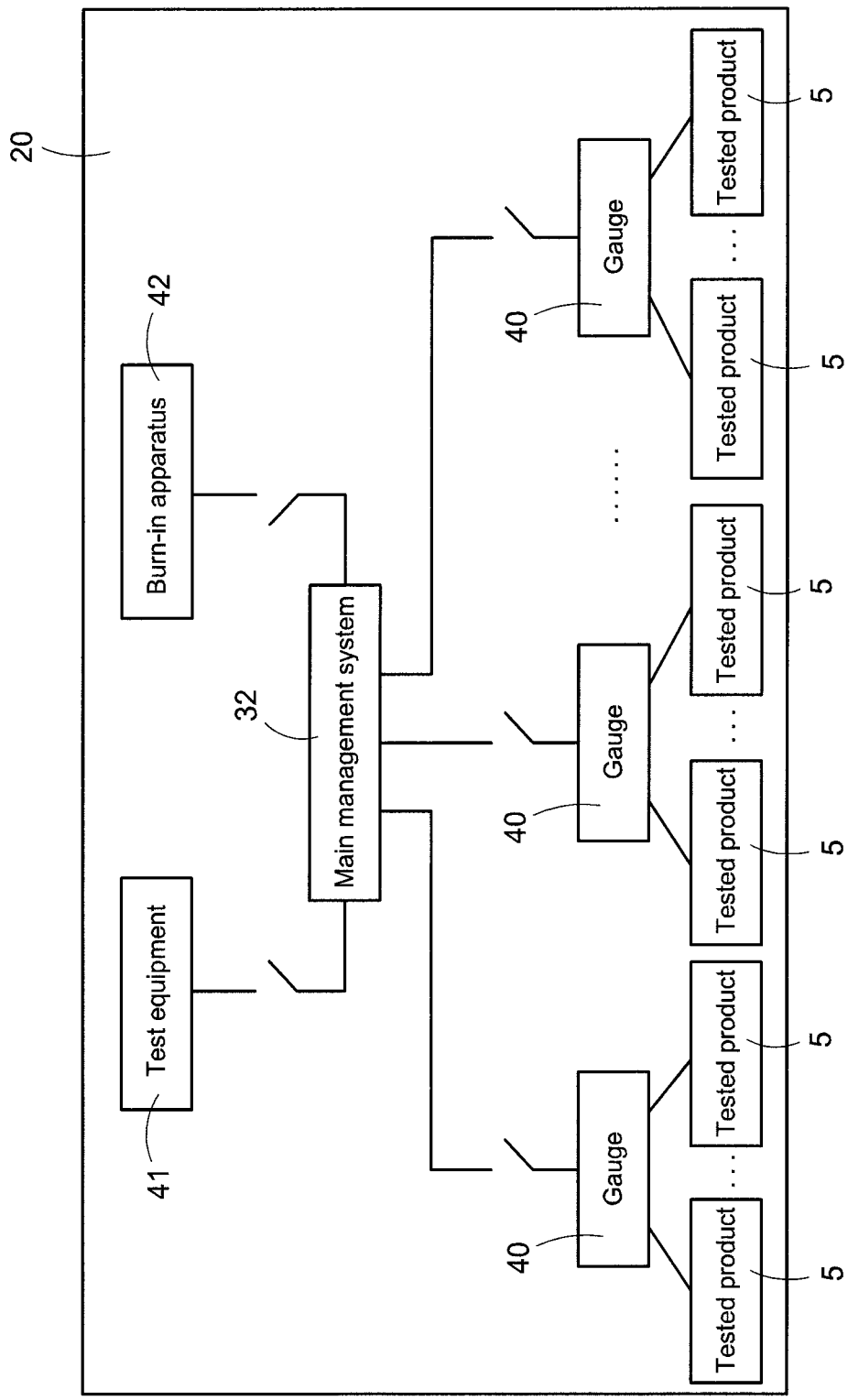
FIG. 3 shows a block diagram of testing system according to a second specific embodiment of the present invention.

Please also refer to FIG. 3, FIG. 3 shows a block diagram of testing system according to a second specific embodiment of the present invention. The present invention is mainly characterized in that, the test equipment 41 and the burn-in apparatus 42 are both arranged in the burn-in chamber 20, accordingly the tested products 5 performs the burn-in procedure, and performs the testing procedure sequentially at the same time. In this way, the time waiting for a particular amount of products being tested before the products enter the burn-in environment together for the burn-in procedure can be saved.

As shown in FIG. 3, the testing system 2 also includes the plurality of gauges 40, the plurality of gauges 40 are arranged in the burn-in chamber 20, and one or more the tested products 5 are inserted in each of the gauges 40 respectively. In an embodiment, at least four tested products 5 can be inserted in each of the gauges 40 respectively, but not limited.

Specifically, the testing system 2 controls the test equipment 41 and the burn-in apparatus 42 by the main management system 32 sequentially according to a schedule. In a default setting, the gauges 40 connect to the burn-in apparatus 42. The burn-in apparatus 42 monitors and collects the data of the tested products 5 upon the gauges 40 during the burn-in procedure.

The present invention is also mainly characterized in that, the main management system 32 can control each of the gauges 40 to disconnect from the burn-in apparatus 42, and connect to the test equipment 41 sequentially according to the schedule for the testing procedure. Besides, after the testing procedure is finished, each of the gauges 40 disconnects from the test equipment 41, and re-connects to the burn-in apparatus 42. In this way, the testing system 2 of the present invention can finish the testing of the tested product 5 sequentially, while the tested products 5 performs the burn-in procedure, thus shortening the time waiting for the testing and improving the testing efficiency.

As to the aforementioned schedule, for example, the main management system 32 can be preset to control a first gauge to connect to the test equipment 41, for making a first tested product upon the first gauge perform the testing procedure. After the testing procedure of the first tested product is finished, the main management system 32 then controls the first gauge to disconnect from the test equipment 41, and re-connect to the burn-in apparatus 42. After the first gauge re-connects to the burn-in apparatus 42, the main management system 32 then controls a second gauge to connect to the test equipment 41, to perform the testing procedure to a second tested product upon the second gauge, and so on.

Figure 4A:
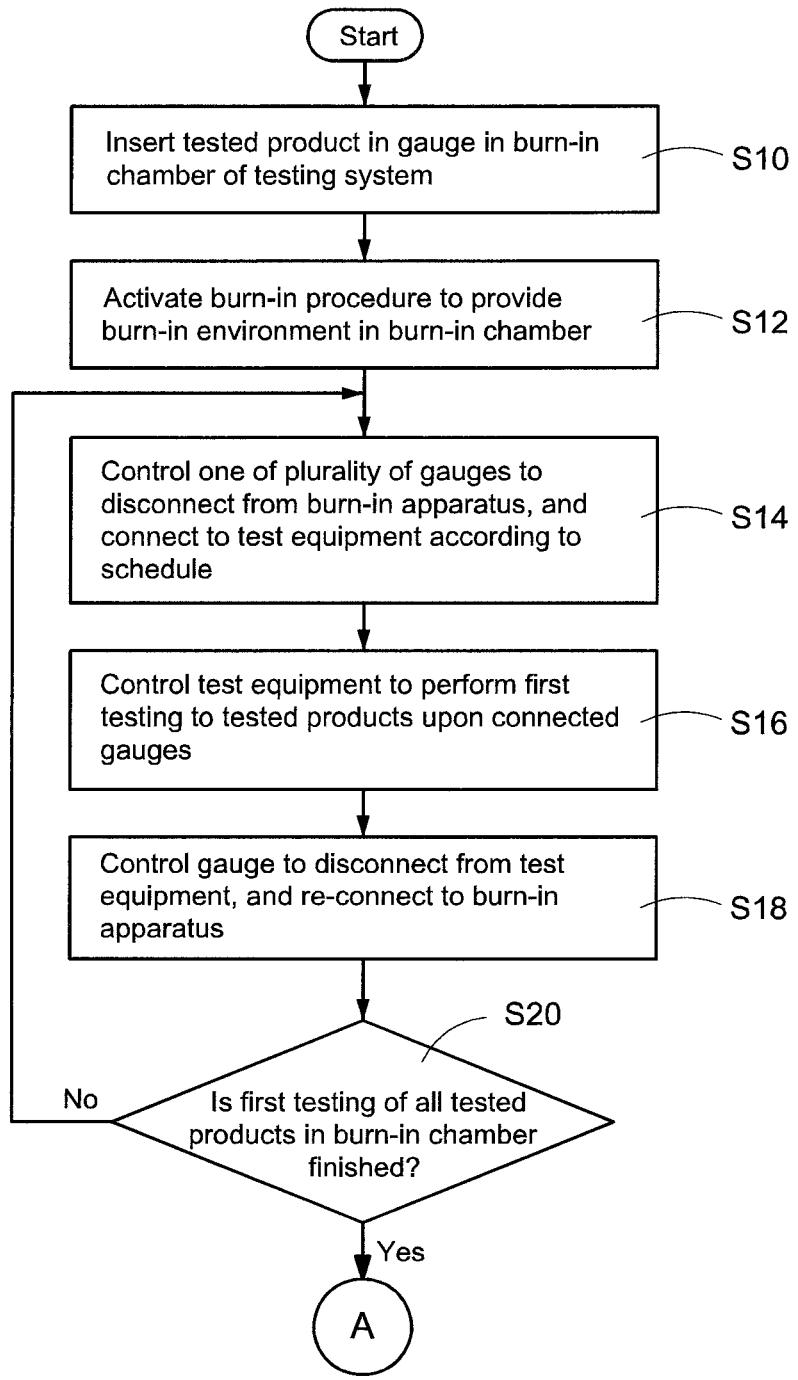
FIG. 4A shows a flowchart of a first testing according to a first specific embodiment of the present invention.
Figure 4B:
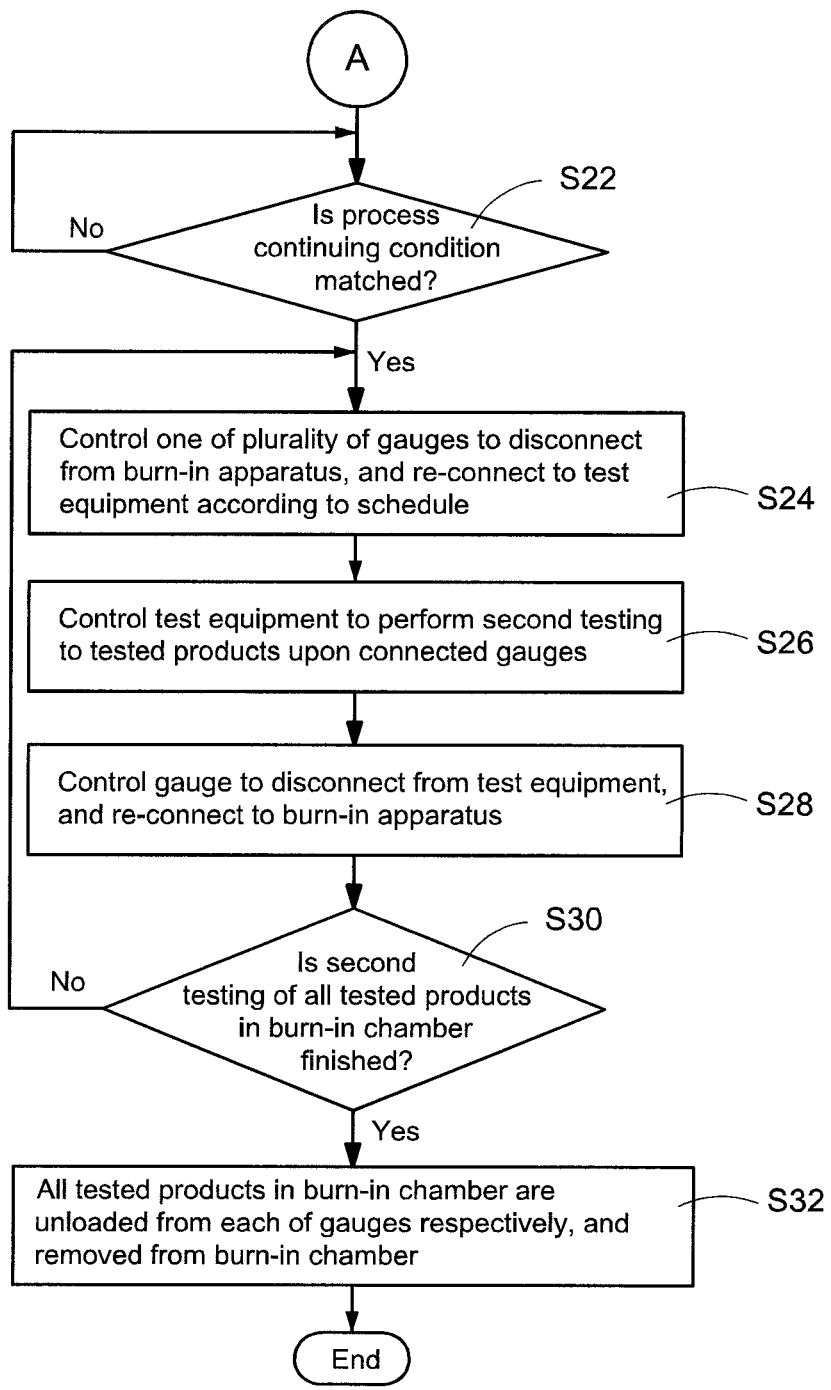
FIG. 4B shows a flowchart of a second testing according to a first specific embodiment of the present invention.

Then please refer to FIG. 4A and FIG. 4B, FIG. 4A shows a flowchart of a first testing according to a first specific embodiment of the present invention, FIG. 4B shows a flowchart of a second testing according to a first specific embodiment of the present invention respectively. FIG. 4A and FIG. 4B discloses a composite product testing method (hereafter the testing method) of the present invention. The testing method is mainly used for the testing system 2 shown in FIG. 2 and FIG. 3.

As shown in FIG. 4A, first, the manufactured tested products 5 are respectively inserted in the gauges 40 in the burn-in chamber 20 of the testing system 2 (step S10). The gauges 40 are preset, but not limited, to connect to the burn-in apparatus 42.

In the beginning of testing, the testing system 2 first controls the burn-in chamber 20 to activate a burn-in procedure by the main management system 32, to provide a burn-in environment in the burn-in chamber 20 (step S12). Specifically, the burn-in environment has temperature and/or humidity different from that of the surrounding environment, making it faster to simulate the tested products 5 in the burn-in chamber 20 as being used for a long time.

Then, the main management system 32 controls (according to a schedule) one of the plurality of gauges 40 to disconnect from the burn-in apparatus 42, and connect to the test equipment 41 (step S14), and controls the test equipment 41 to perform a first testing to the tested products 5 upon the connected gauges 40 (step S16). Specifically, the main management system 32 connects and controls the test management system 33, to control the test equipment 41 to execute the first testing by the test management system 33.

In an embodiment, the tested product 5 is an electronic product (such as a power supply), the first testing is noise testing, protection testing, hi-pot testing, efficiency testing, power characteristic testing or communication testing etc.

After the first testing is finished, the main management system 32 then controls the gauge 40 to disconnect from the test equipment 41, and re-connect to the burn-in apparatus 42 (step S18). Accordingly, the burn-in apparatus 42 keeps monitoring and collecting data of the tested products 5 upon the gauges 40 during the burn-in procedure. In an embodiment, the burn-in apparatus 42 keeps monitoring and collecting voltage data and/or current data of the tested product 5, to determine if the performance of the tested product 5 changes during the burn-in procedure (such as fault or lowered efficiency).

It should be noted that, in step S18, the main management system 32 connects and controls the burn-in management system 34, to control the burn-in apparatus 42 to monitor and collect the data by the burn-in management system 34.

After step S18, the first testing of one or more tested products 5 inserted in a set of gauges 40 has been finished. The main management system 32 then determines if the first testing of all tested products in the burn-in chamber 20 has been finished (step S20). Specifically, all gauges 40 in the burn-in chamber 20 connect to the burn-in apparatus 42, and the main management system 32 only controls a set of gauges 40 to connect to the test equipment 41 (there is only one test equipment 41 for example) at one time. If four tested products 5 can be inserted into a set of gauges 40 at one time, then only four tested products 5 are subject to the first testing of the test equipment 41 at one time.

If the main management system 32 determines that the first testing of all tested products in the burn-in chamber 20 has not been finished, and then the main management system 32 repeats to execute step S14 to step S18. Accordingly, the main management system 32 controls (according to the schedule) each of the gauges 40 to disconnect from the burn-in apparatus 42 and connect to the test equipment 41 sequentially, to perform the first testing. After the first testing is finished, each of the gauges 40 re-connects to the burn-in apparatus 42, till the first testing of all tested products in the burn-in chamber 20 is finished.

After the first testing of all tested products in the burn-in chamber 20 is finished, the plurality of gauges 40 all keep connecting to the burn-in apparatus 42, and the main management system 32 then determines if a process continuing condition is matched (step S22). In an embodiment, the process continuing condition can be the first testing of all tested products 5 in the burn-in chamber 20 is finished. In another embodiment, the process continuing condition can be the burn-in procedure has been executed on a specific time after the first testing of all tested products 5 is finished (step S20). After the process continuing condition is matched, the testing system 2 can perform a second testing to the tested products 5 according to the schedule.

Specifically, the first testing is aimed to check if the manufactured tested products 5 have fault, and the second testing is aimed to test if the tested products 5 after burn-in keep working normally. Thus, the testing system 2 needs to wait the tested products 5 in the burn-in procedure for a specific time before performing the second testing.

For example, if there are a hundred sets of the gauges 40 in the burn-in chamber 20, and the test equipment 41 takes 3 minutes for executing the first testing, and then when the first testing of the tested products 5 upon all gauges 40 is finished, the tested products 5 upon the first set of gauges 40 has been in the burn-in procedure for 297 minutes ((100−1)*3 minutes). Thus, after the first testing of the tested product 5 upon the last set of gauges 40 is finished, the testing system 2 can directly perform the second testing to the tested products 5 upon the first set of gauges 40.

As shown in FIG. 4B, after the process continuing condition is matched, the main management system 32 then according to the schedule controls one of the plurality of gauges 40 to disconnect from the burn-in apparatus 42, and re-connect to the test equipment 41 (step S24). Accordingly, the second testing is performed to the tested products 5 upon the connected gauges 40 by the test equipment 41 (step S26). It should be noted that, the main management system 32 connects and controls the test management system 33, to control the test equipment 41 to execute the second testing by the test management system 33.

Specifically, the main management system 32 controls connection between each of the gauges 40 and the test equipment 41 and the burn-in apparatus 42 according to the schedule. Thus, the first set of gauges connecting to the test equipment 41 in step S24 should be identical to in step S14 the first set of gauges (such as a first gauge) connecting to the test equipment 41, the second set of gauges connecting to the test equipment 41 in step S24 should be identical to in step S14 the second set of gauges (such as a second gauge) connecting to the test equipment 41, and so on.

After the second testing is finished, the main management system 32 controls the gauge 40 to disconnect from the test equipment 41, and re-connect to the burn-in apparatus 42 (step S28). Accordingly, the burn-in apparatus 42 keeps monitoring and collecting the data of the tested products 5 upon the gauge 40, till the burn-in procedure is finished (for example, 2 hours). It should be noted that, the main management system 32 connects and controls the burn-in management system 34, to control the burn-in apparatus 42 to monitor and collect the data by the burn-in management system 34.

After step S28, the main management system 32 determines if the second testing of all tested products 5 in the burn-in chamber 20 has been finished (step S30). Besides, the main management system 32 repeats to execute step S24 to step S28, before the second testing of all tested products 5 is finished, according to the same schedule to control connection between each of the gauges 40 and the test equipment 41 and the burn-in apparatus 42, to perform the second testing of the tested products 5 upon each of the gauge 40 sequentially.

As mentioned above, the first testing tests if the manufactured product has fault, while the second testing tests if the products keep working normally after being used for a long time (that is, after the burn-in procedure). In the embodiment, the first testing and the second testing are executed by the same test equipment 41. Thus, in an embodiment, a testing content of the first testing and a testing content of the first testing may be, but not limited to be, identical.

After the second testing of all tested products 5 in the burn-in chamber 20 is finished, all tested products 5 in the burn-in chamber 20 are unloaded from each of the gauges 40 respectively, and removed from the burn-in chamber 20 (step S32), to package and transmit the tested products 5 in the following.

In an embodiment, four tested products 5 can be inserted in each of the gauges 40 at the same time, and the test equipment 41 takes 45 seconds for executing testing (including the first testing and the second testing) twice, 640 tested products 5 (that is, there are 160 gauges 40) can be accommodated in the burn-in chamber 20, and the burn-in procedure takes two hours.

In the embodiment, the testing time for executing two times of testing to all tested products 5 is 7200 seconds ((640/4)*45 seconds), identical to that of the burn-in procedure exactly. That is, by the testing system 2 and the testing method of the present invention, the tested products 5 during testing wastes no time for waiting, thus the testing efficiency can be improved effectively.

Besides, by the testing system and testing method of the present invention, all tested products 5 only need to be inserted in/unloaded from the gauges 40 once, to finish the first testing, burn-in procedure and second testing, even third, fourth testing. Thus, the time spent for the tested products 5 inserted in/unloaded from the gauges 40 can be saved, the risk of damaging the tested products 5 or gauges 40 from inserting, unloading can be avoided effectively.

Figure 5:
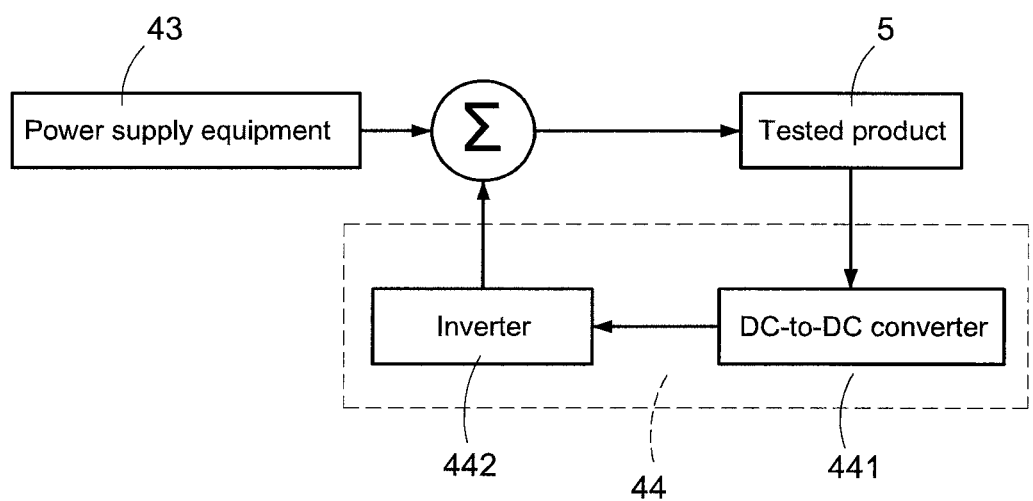
FIG. 5 shows a diagram of an energy recycle system according to a first specific embodiment of the present invention.

Refer to FIG. 5, FIG. 5 shows a diagram of an energy recycle system according to a first specific embodiment of the present invention. In an embodiment, the testing system 2 further includes power supply equipment 43 and an energy recycle system (ERS) 44.

As shown in FIG. 5, the power supply equipment 43 electrically connects to the tested products 5, to provide power to the tested products 5. In the embodiment, the tested product 5 is operating in the first testing, the burn-in procedure and the second testing, the test equipment 41 tests each capability of the tested product 5 when the tested product 5 is operating, and the burn-in apparatus 42 tests the data of the tested product 5 when the tested product 5 is operating.

The energy recycle system 44 electrically connects to the tested products 5 and the power supply equipment 43, for receiving power generated by operation of the tested products 5, and feeding the received power to the power supply equipment 43.

Specifically, as shown in FIG. 5, the energy recycle system 44 includes a DC-to-DC converter 441 and an inverter 442. The inverter 442 electrically connects to the DC-to-DC converter 441. The DC-to-DC converter 441 electrically connects to the tested product 5 (for example, a power supply), to receive and process dc power generated from the operation of the tested product 5. The inverter 442 receives the dc power and the DC-to-DC converter 441 converts the dc power to ac power, and then feeds the ac power to the power supply equipment 43.

For example, the tested product 5 needs power of 10 kW for operation (that is, the power supply equipment 43 needs to provide power of 10 kW to the tested product 5), and converting efficiency of the tested product 5 (for example, the aforementioned power supply) is 85%, thus dc power of 8.5 kW can be generated after being energized. The converting efficiency of the DC-to-DC converter 441 is 90%, thus dc power of 7.65 kW can be generated after the dc power generated from the tested product 5 is received and processed.

As mentioned above, the converting efficiency of the inverter 442 is 90%, thus after the DC-to-DC converter 441 receives the dc power, ac power of 6.885 kW can be generated by converting the dc power. Accordingly, the inverter 442 can feed ac power of 6.885 kW to the power supply equipment 43. In this way, the power supply equipment 43 keeps providing power of 10 kW to the tested product 5 when the tested product 5 works normally at work point, the power supply equipment 43 can decrease the output power and only provide power of 3.115 kW (10 kW-6.885 kW), to maintain the tested product 5 working normally. It can be seen from above that, power of the testing system 2 for executing the testing procedure and the burn-in procedure can be largely reduced according to setting of the energy recycle system 44.

In aforementioned embodiment, the energy recycle system 44 receives power generated from operation of the tested product 5, and feeds the received power to the power supply equipment 43. In other embodiment, the energy recycle system 44 also can provide the received power to other equipment (not shown), and not limited to feed to the power supply equipment 43.

Figure 6:
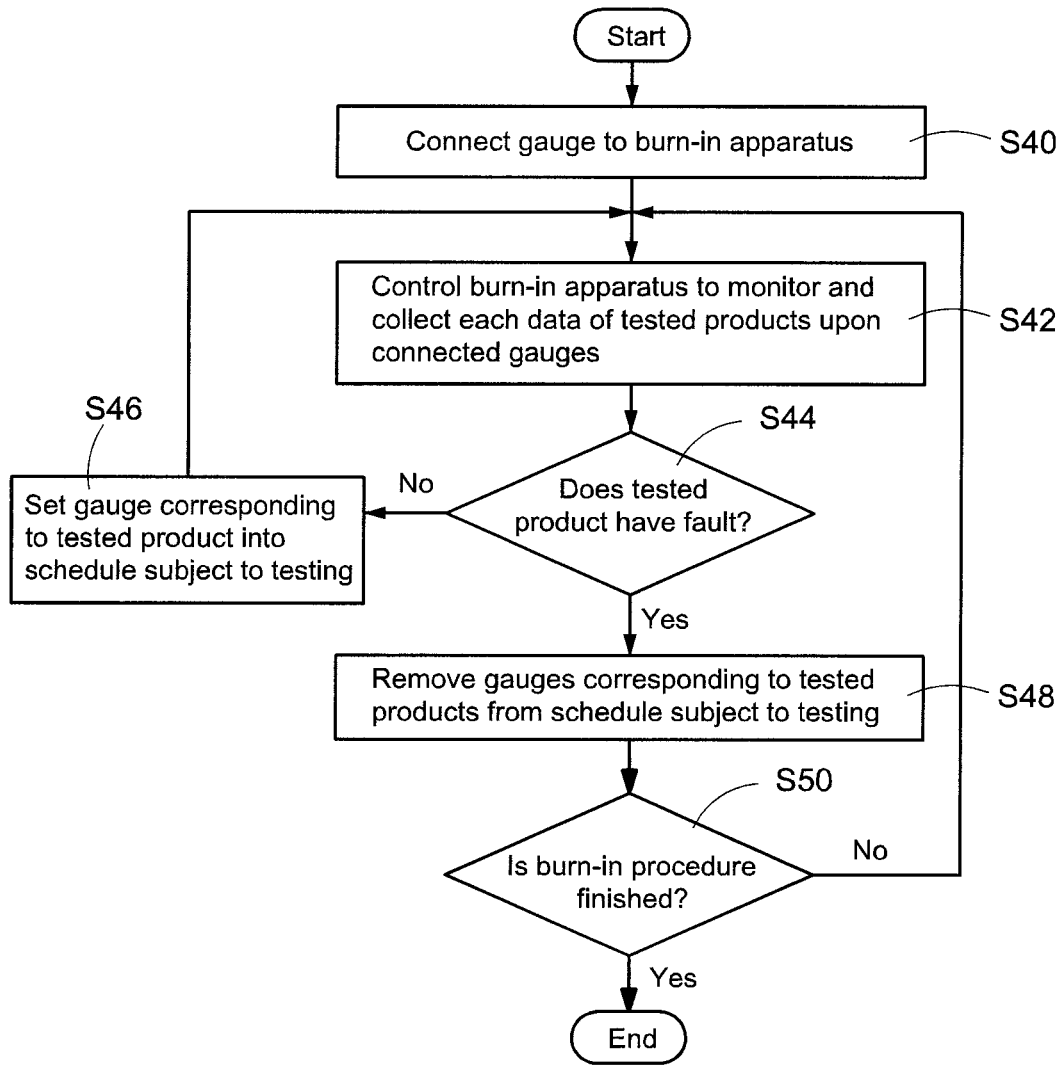
FIG. 6 shows a flowchart of a testing according to a second specific embodiment of the present invention.

Then please refer to FIG. 6, FIG. 6 shows a flowchart of a testing according to a second specific embodiment of the present invention. In an embodiment, the testing system 2 can determine if the performance of the tested products 5 change during the burn-in procedure by the data collected by the burn-in apparatus 42, thus determine whether to perform the first testing and the second testing to the tested products 5.

As shown in FIG. 6, first, before the first testing of each of the gauges 40, or after the first testing, the main management system 32 controls the tested products 5 to connect to the burn-in apparatus 42 (step S40). Accordingly, the burn-in apparatus 42 can monitor and collect the data of the tested products 5 upon the gauges 40 (step S42), and determine if each of the tested products 5 has fault according to the collected data (step S44).

If the main management system 32 determines that none of the tested products 5 has fault, and then sets the gauge 40 corresponding to the tested product 5 into a schedule subject to the first testing or the second testing (step S46). Otherwise, if the main management system 32 determines that any one of the tested products 5 has fault, it means that the testing system 2 does not need to perform testing to the tested products 5, thus the main management system 32 removes the gauges 40 corresponding to the tested products 5 from the schedule subject to the first testing or the second testing (step S48).

Further, the main management system 32 determines if the burn-in procedure is finished (step S50), and keeps executing step S42 to step S48 before the burn-in procedure ends, to keep monitoring and collecting the data of the tested products 5, and to determine if the performance of the tested products 5 change and have fault during the burn-in procedure.

The burn-in procedure and necessary testing can be performed to the tested product at the same time, accordingly saving time spent for waiting the testing, and improving the testing efficiency largely by the testing system and testing method of the present invention.

Thus, particular embodiments have been described. Other embodiments are within the scope of the following claims. For example, the actions recited in the claims may be performed in a different order and still achieve desirable results.

What is claimed is:

1. A product testing system comprising:
   a burn-in chamber providing a burn-in environment;
   a plurality of gauges arranged in the burn-in chamber, and a product inserted in each of the plurality of gauges respectively;
   a burn-in apparatus arranged in the burn-in chamber, connecting to the plurality of gauges;
   a test equipment arranged in the burn-in chamber;
   a power supply equipment providing power to the product;
   an energy recycle system receiving power generating from the product, and feeding the received power back to the power supply equipment; and
   a main management system controlling the plurality of gauges to connect to and disconnect from the burn-in apparatus and the test equipment;
   wherein the main management system controls one of the plurality of gauges to connect to the test equipment, before a first testing of all products in the burn-in chamber is finished, for performing the first testing to the product on one of the plurality of gauges schedule sequentially, and to disconnect from the test equipment and re-connect to the burn-in apparatus after the first testing is finished.

2. The product testing system of claim 1, wherein the product testing system further comprises a test management system arranged for controlling the test equipment.

3. The product testing system of claim 2, wherein the product testing system further comprises a burn-in management system arranged for controlling the burn-in apparatus.

4. The product testing system of claim 3, wherein the main management system connects to the test management system and the burn-in management system, for controlling the test equipment and the burn-in apparatus.

5. The product testing system of claim 1, wherein four products are inserted in each of the gauges respectively.

6. The product testing system of claim 1, wherein the energy recycle system comprises:
   a DC-to-DC converter receiving and processing dc power generated from the product; and
   an inverter connecting to the DC-to-DC converter and the power supply equipment, feeding the ac power back to the power supply equipment after receiving and converting the dc power to the ac power.

7. The product testing system of claim 1, wherein the main management system controls one of the plurality of gauges to disconnect from the burn-in apparatus and connect to the test equipment sequentially when a process continuing condition is matched, for the test equipment executing a second testing to the product on one of the plurality of gauges sequentially, and to disconnect from the test equipment and re-connect to the burn-in apparatus after the second testing is finished.

8. The product testing system of claim 7, wherein a testing content of the first testing is identical to a testing content of the second testing.

9. The product testing system of claim 7, wherein the process continuing condition is that the first testing of all products in the burn-in chamber is finished.

10. The product testing system of claim 7, wherein the burn-in chamber provides the burn-in environment by executing a burn-in procedure, the process continuing condition is that the burn-in procedure is executed for a specific time.

11. A product testing method used for the product testing system of claim 1, and the product testing method comprising:
   a) controlling the burn-in chamber to provide a burn-in environment by the main management system;
   b) controlling one of the plurality of gauges to disconnect from the burn-in apparatus and connect to the test equipment by the main management system, for the test equipment performing a first testing to the product upon the gauge connected;
   c) controlling one of the plurality of gauges to disconnect from the test equipment and re-connect to the burn-in apparatus by the main management system, after the first testing being finished;
   d) determining if the first testing of all products in the burn-in chamber is finished; and
   e) repeating to execute step b and step c, for the test equipment performing the first testing to the product on each of the plurality of gauges sequentially according to a schedule, before the first testing of all products is finished.

12. The product testing method of claim 11, wherein the product testing system further comprises a test management system for controlling the test equipment, and a burn-in management system for controlling the burn-in apparatus, in step b and step c, the main management system connecting to the test management system and the burn-in management system for controlling the test equipment and the burn-in apparatus.

13. The product testing method of claim 11, wherein the product testing method further comprises steps of:
   f) determining if the product has fault according to data collected by the burn-in apparatus;
   g) setting the gauge corresponding to the product into the schedule subject to the first testing when the product having no fault; and
   h) removing the gauge corresponding to the product from the schedule subject to the first testing when the product having fault.

14. The product testing method of claim 11, wherein the product testing method further comprises steps of:

i) determining if a process continuing condition is matched by the main management system;

j) controlling one of the plurality of gauges to disconnect from the burn-in apparatus and re-connect to the test equipment when the process continuing condition being matched, for the test equipment performing a second testing to the product upon the gauge;

k) controlling one of the plurality of gauges to disconnect from the test equipment and re-connect to the burn-in apparatus when the second testing being finished, for the burn-in apparatus collecting data of the product upon the gauge during the burn-in procedure;

l) determining if the second testing of all products in the burn-in chamber is finished; and m) repeating to execute step j and step k, before the second testing of all products is finished, for performing the second testing to the product on each of the plurality of gauges sequentially according to the schedule.

15. The product testing method of claim 14, wherein a testing content of the first testing is identical to a testing content of the second testing.

16. The product testing method of claim 14, wherein the process continuing condition is that the first testing of all products in the burn-in chamber is finished.

17. The product testing method of claim 14, wherein step a is controlling the burn-in chamber to activate a burn-in procedure for providing the burn-in environment, the process continuing condition is that the burn-in procedure is executed for a specific time.

18. The product testing method of claim 14, wherein the product testing method further comprises a step of:

n) unloading all products from each of the gauges in the burn-in chamber respectively and removing all products from the burn-in chamber after step m.

19. The product testing method of claim 14, wherein the product testing method further comprises steps of:

o) determining if the product has fault according to the data collected by the burn-in apparatus;

p) setting the gauge corresponding to the product into a schedule subject to the second testing when the product having no fault; and q) disconnecting the gauge corresponding to the product from the schedule subject to the second testing when the product having fault.

* * * * *